United States Patent [19]

Hawkins et al.

[11] Patent Number: 4,746,622

[45] Date of Patent: May 24, 1988

[54] PROCESS FOR PREPARING A CHARGE COUPLED DEVICE WITH CHARGE TRANSFER DIRECTION BIASING IMPLANTS

[75] Inventors: Gilbert A. Hawkins, Mendon; David L. Losee, Fairport; Robert L. Nielsen, Pittsford, all of N.Y.

[73] Assignee: Eastman Kodak Company, Rochester, N.Y.

[21] Appl. No.: 916,259

[22] Filed: Oct. 7, 1986

[51] Int. Cl.⁴ .............................................. H01L 29/78
[52] U.S. Cl. ...................................... 437/26; 437/29; 437/53; 437/186; 437/200; 357/24
[58] Field of Search .............. 357/24; 148/DIG. 141; 437/26, 29, 53, 186, 200

[56] References Cited

U.S. PATENT DOCUMENTS

| | | | |
|---|---|---|---|
| 3,651,349 | 3/1972 | Kahng et al. | 307/304 |
| 3,700,932 | 10/1972 | Kahng | 357/24 |
| 3,789,267 | 1/1974 | Krambeck et al. | 317/235 R |
| 3,927,468 | 12/1975 | Anthony et al. | 357/24 |
| 4,035,906 | 7/1977 | Tasch et al. | 357/24 |
| 4,047,215 | 9/1977 | Frye et al. | 357/24 |
| 4,215,357 | 7/1980 | Kohyama et al. | 357/24 |
| 4,229,752 | 10/1980 | Hynecek | 357/24 |
| 4,273,596 | 6/1981 | Gutierrez et al. | 29/571 |
| 4,290,187 | 9/1981 | Stein | 29/576 B |
| 4,319,261 | 3/1982 | Kub | 357/24 |
| 4,347,656 | 9/1982 | Smith et al. | 29/571 |
| 4,365,261 | 12/1982 | Chatterjee et al. | 357/24 |
| 4,377,904 | 3/1983 | Chapman et al. | 29/571 |
| 4,402,014 | 8/1983 | Carasso et al. | 357/24 |
| 4,613,402 | 9/1986 | Losee et al. | 357/24 |

Primary Examiner—Olik Chaudhuri
Attorney, Agent, or Firm—Carl O. Thomas

[57] ABSTRACT

A process is disclosed of preparing a charge coupled device containing charge transfer direction biasing implants wherein the steps and materials for patterning electrodes and implants promote accurate edge alignments of implants and electrodes while minimizing strains and avoiding temperatures that permit unwanted lattice or intersticial ion migration in the semiconductive substrate.

13 Claims, 8 Drawing Sheets

PROCESS FOR PREPARING A CHARGE COUPLED DEVICE WITH CHARGE TRANSFER DIRECTION BIASING IMPLANTS

FIELD OF THE INVENTION

The invention relates to processes for preparing semiconductor devices. More specifically, the invention is directed to processes for preparing virtual or two phase charge coupled devices.

BACKGROUND OF THE INVENTION

Charge coupled devices (hereinafter also referred to as CCD's) have found wide acceptance as shift registers for transporting charge in semiconductive substrates. A series of laterally spaced gate electrodes adjacent but conductively separated from the semiconductive substrate are relied upon to transport the charge in discrete steps within the semiconductive substrate. Each charge transfer step is achieved by proper poential biasing of gate electrodes so that charge is attracted from one charge storage region to a next adjacent charge storage region in the semiconductive substrate.

Figure 1:
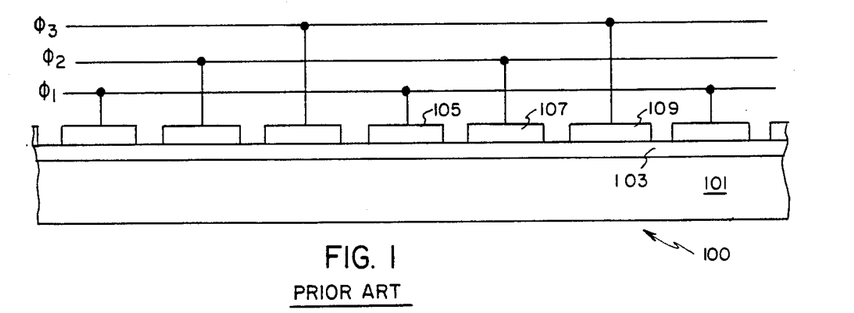
FIGS. 1, 5, 8, 9, and 12 are schematic diagrams of CCD's representative of the prior state of the art.

Three phase CCD's, such as those described in Kahng U.S. Pat. No. 3,700,932, are among the simplest to construct. In FIG. 1 is shown a schematic diagram of a three phase CCD 100 comprised of a semiconductive substrate 101 of a first, N or P, conductivity type. An insulative layer 103 overlies the semiconductive substrate, and a series of spaced apart conductive gate electrodes overlie the insulative layer. The gate electrodes consist of a first set of gate electrodes 105 electrically connected to a $\Phi_1$ power supply; a second set of gate electrodes 107 electrically connected to a $\Phi_2$ power supply; and a third set of gate electrodes 109 electrically connected to a $\Phi_3$ power supply.

Figure 2:
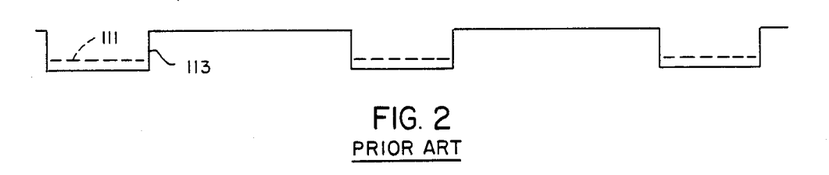
FIGS. 2, 3, 4, 6, 7, 10, 11, 13, and 14 are diagrams of the potential profiles within CCD's at different stages of electrical biasing.
Figure 3:
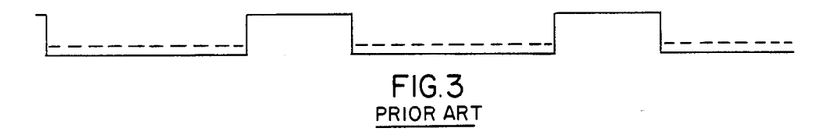
Figure 4:
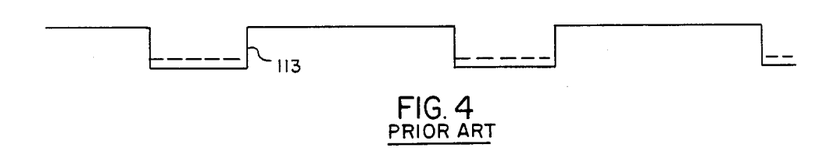

The manner in which the three phase CCD laterally transports charge can be appreciated by reference to potential diagrams of FIGS. 2 through 4. In the initial condition shown in $\Phi_1$ gate electrodes are electrically biased to attract minority charge carriers in the semiconductive substrate. For example, if the semiconductive substrate exhibits P type conductivity, the minority charge carriers are electrons, and the $\Phi_1$ electrodes are positively biased to attract the electrons. Referring to FIG. 2, with the exemplary conditions above, the direction of positive potential is down, and the electrons 111 are held in potential wells 113, which are physically located beneath the electrodes 105. The gate elctrodes 107 and 109 are shown in FIG. 2 as being at the same potential, which is negative relative to the gate electrodes 105.

The electrons 111 in each potential well are laterally transported by first biasing the $\Phi_2$ power power supply to the $\Phi_1$ potential as shown in FIG. 3, thereby allowing the electrons 111 to spread beneath adjacent pairs of gate electrodes 105 and 107, and then biasing the $\Phi_1$ power supply negatively so that the potential well is reformed beneath the gate electrodes 107, as shown in FIG. 4. Further lateral shifting is achieved by applying the above described procedure to successive pairings of gate electrodes.

For ease of illustration the simple laterally spaced gate electrode constructions are shown, but the potential variations resulting are ignored, since they can be minimized by known techniques for minimizing gate lateral spacing, such as those illustrated by Smith et al U.S. Pat. No. 3,921,195.

While three phase CCD's are simple in construction, the three phase clocking required for charge transport has been regarded as disadvantageous, and the art has sought to construct a CCD capable of being driven by a two phase clock. To be driven by a two phase clock, the CCD must be modified in construction to directionally bias charge transfer.

Figure 5:
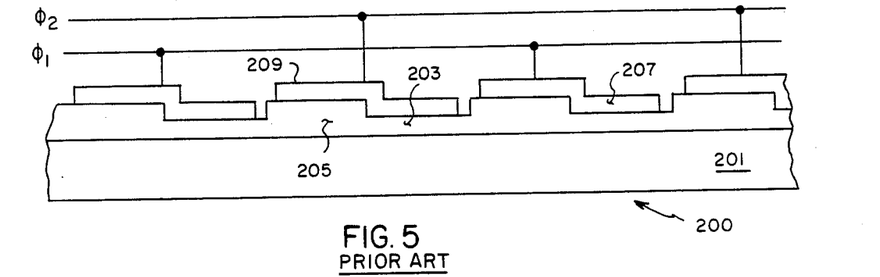

An early two phase CCD, such as described in Kahng et al U.S. Pat. No. 3,651,349, is shown in FIG. 5, wherein the CCD 200 is comprised of a semiconductive substrate 201 of a first, N or P, conductivity type. An insulative layer formed as a succession of alternate thinner portions 203 and thicker portions 205 overlies the semiconductive substrate, and a series of spaced apart conductive gate electrodes each overlying one thicker and one adjacent thinner portion of the insulative layer. The gate electrodes consist of a first set of gate electrodes 207 electrically connected to a $\Phi_1$ power supply and a second set of gate electrodes 209 electrically connected to a $\Phi_2$ power supply.

Figure 6:
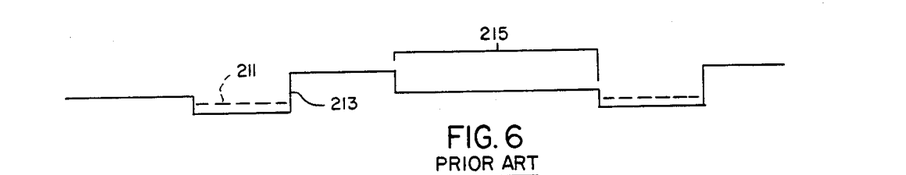
Figure 7:
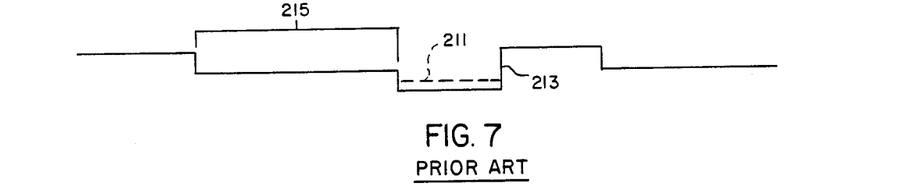

The operation of the two phase CCD 200 can be appreciated by reference to potential diagrams 6 and 7. Assuming the semiconductive substrate 201 is of P type conductivity and the $\Phi_1$ power supply is initially biased positively, electrons 211 are initially confined to potential wells 213 which in this instance are physically located beneath the portions of the first gate electrodes 207 overlying the thinner portions 203 of the insulative layer. The second set of gate electrodes 209 is related in potential to the first set so that the potential of the portions of the gate electrodes 209 overlying the thinner portions of the insulative layer are at a potential equal to that of the portions of the first set of gate electrodes overlying the thicker portions of the insulative layer. This is shown in FIG. 6 as the uniform potential region 215.

When the relative potentials of the $\Phi_1$ and $\Phi_2$ power supplies are reversed, as shown in FIG. 7, the electrons 211 and potential well 213 are shifted to beneath the portions of the second set of gate electrodes 209 overlying the thinner portions 203 of the insulative layer. In shifting between their FIG. 6 and FIG. 7 positions the electrons 211 traverse the essentially uniform potential region 215 in FIG. 7.

Two phase CCD's such as CCD 200 have been found disadvantageous to manufacture, since the insulative layer must be formed in muliple steps to achieve the required thickness differences. Further, this nonuniformity of the insulative layer requires portions of the gate electrodes to lie in different planes, thereby also complicating their fabrication.

The art has therefore shown a preference for two phase CCD's having a simpler insulative layer and gate electrode construction relying on zones of increased impurity dopant concentration in the semiconductive substrate for directional biasing of charge transfer, as illustrated by Krambeck U.S. Pat. No. 3,789,267. Such CCD's are illustrated by CCD 300 in FIG. 8, in which a semiconductive substrate 301 of a first conductivity type supports an insulative layer 303 on which interlaid sets of gate electrodes 305 and 307 connected to the $\Phi_1$ and $\Phi_2$ power sources, respectively, are positioned. As shown, zones 309 are formed in the semiconductive substrate. The zones exhibit a higher level of impurity doping than the surrounding portions of the semiconductive substrate. The zones can also be of the first conductivity type, as taught by Krambeck U.S. Pat. No. 3,789,267, or can alteratively be of a second, opposite conductivity type, as taught by Tasch et al U.S. Pat. No. 4,035,906.

Figure 8:
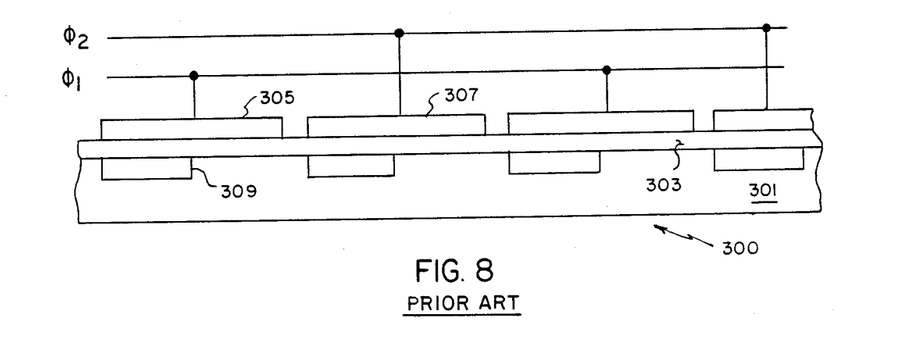

When the higher dopant level zones 309 are of the first conductivity type and exactly aligned with the left edges of the gate electrodes, as shown in FIG. 8, charge is transferred as described above by reference to the potential diagrams of FIGS. 6 and 7. When the higher dopant level zones are of the second conductivity type and exactly aligned with the right edges of the gate electrodes, charge is transferred as described above by reference to the potential diagrams of FIGS. 6 and 7. Stated another way, when the higher dopant level zones are of the second conductivity type and located as shown in FIGS. 8, charge is transferred as described above by reference to the potential diagrams of FIGS. 6 and 7, except that the direction of transfer is reversed.

The art has heretofore encountered some difficulty in consistently constructing to satisfy desired performance criteria two phase CCD's with implanted doping impurity zones to bias directionally charge transfer.

Figure 9:
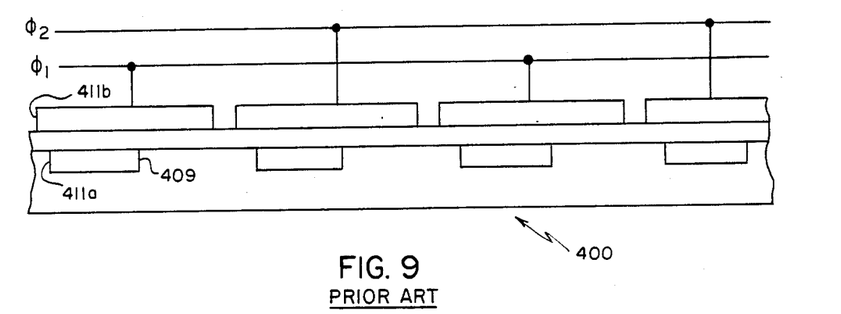

One of the major difficulties encountered is the necessity of accurately aligning the edges of the higher dopant level zones with the overlying edges of the gate electrodes. This is illusrated by the CCD 400 schematically diagrammed in FIG. 9. The CCD 400 is identical to the CCD 300, except that the othewise corresponding higher dopant level zones 409 are each displaced laterally so that the edge 411a lying nearest the next adjacent gate electrode is actually recessed beneath the edge 411b of the overlying gate electrode rather than being directly vertically aligned, as is the case in CCD 300.

Figure 10:
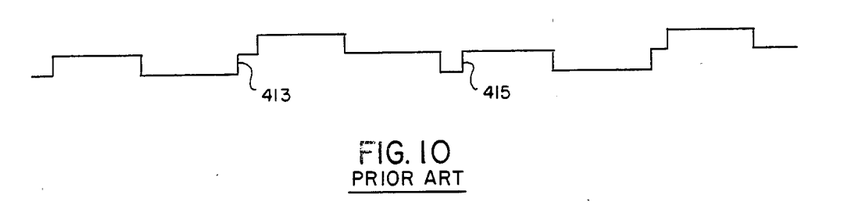
Figure 11:
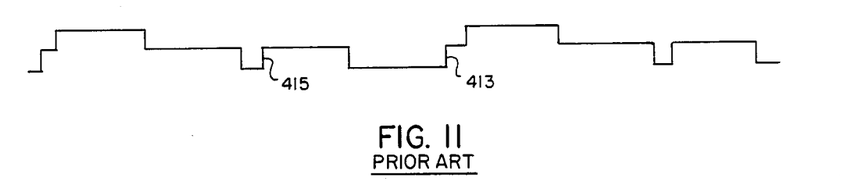

The impact on performance of failing to align the higher dopant level zones and gate electrode edges can be appreciated by referring to the potential diagrams of FIGS. 10 and 11, which correspond to those of FIGS. 6 and 7, except for differences imparted by the above described misalignment of the gate electrode and zone edges. Assuming that charge to be transported is initially present in the potential wells 413 in FIG. 10, it is apparent that reversing the relative biasing of the two phase power supply cannot succeed in transporting the charge in tact to the potential wells 413 in FIG. 11. Instead a portion of the charge will be trapped in the unwanted potential wells 414, which result from the misalignment of the higher dopant level zone and gate electrode edges.

Figure 12:
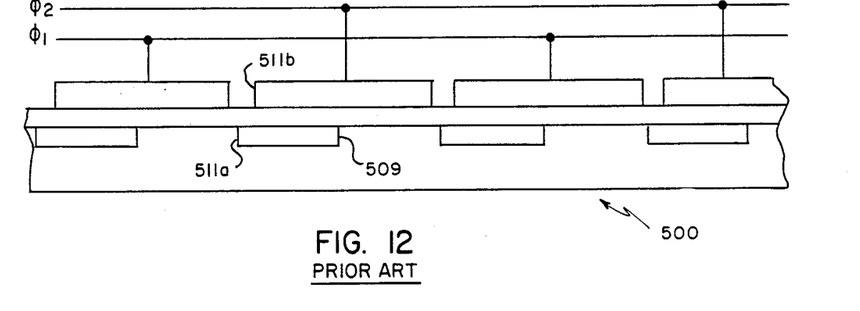
Figure 13:
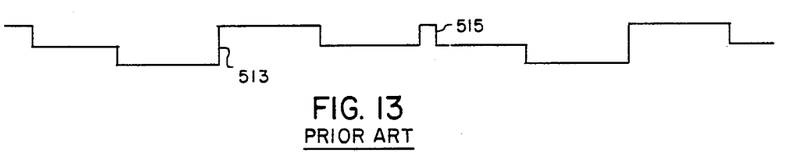
Figure 14:
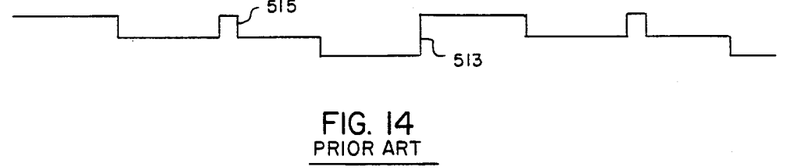

FIG. 12 is a schematic diagram of a CCD 500 identical to CCD 300, but differing in that the higher dopant level zones 509 present edges 511a that extend laterally beyond the edges 511b of the overlying gate electrodes. The disruption of charge transfer can be appreciated by reference to the potential diagrams of FIGS. 13 and 14, which correspond to those of FIGS. 6 and 7, except for differences imparted by the above described misalignment of the gate electrode and zone edges. Assuming that charge to be transported is initially present in the potential wells 513 in FIG. 13, it is apparent that reversing the relative biasing of the two phase power supply cannot succeed in transporting the charge to the potential wells 513 in FIG. 14. The reason is that the misalignment of the higher dopant level zone and gate electrode edges in the manner shown in FIG. 12 creates unwanted potential barriers 515 that disrupt charge transfer from a $\Phi_1$ potential well to a $\Phi_2$ potential well and vice versa.

Approaches heretofore disclosed in the art for manufacturing two phase CCD's with higher dopant level zones in the semiconductive substrate to directionally bias charge transport have suffered a number of limitations. The earliest manufacturing approaches relied upon accurate edge alignments of masks successively employed during fabrication to achive zone and gate electrode edge alignments. As gate electrode areas have decreased, these accurate mask alignments have become increasingly more essential to acceptable performance and more difficult to realize. A variety of manufacturing compromises have been resorted to, such as doubling the number of gate electrodes and externally wiring adjacent plate pairs to a common potential source; introducing higher dopant level zones for one phase at a different processing stage than those for the remaining phase, thereby risking nonuniformity of the higher dopant level zones; and working out self-aligning techniques for one set of gate electrodes and higher dopant level zones while requiring a different approach for the remaining set or sets of gate electrodes and higher dopant level zones.

In addition to three phase CCD's and two phase CCD's there are uniphase CCD's, commonly alternatively referred to as virtual phase CCD's. Typical virtual phase CCD's are described in Fry et al U.S. Pat. No. 4,047,215 and Hynecek U.S. Pat. No. 4,229,752. Virtual phase CCD's differ in construction from the two phase CCD's described above in that the $\Phi_2$ gate electrodes are replaced by virtual phase electrodes formed by an additional uniform diffusion of impurity ions into the semiconductive substrate in areas which would otherwise underlie the $\Phi_2$ gate electrodes. The virtual phase electrodes are used to uniformly fix or pin the potential profile of these substrate regions. To conduct charge the $\Phi_1$ gate electrodes are driven by a single phase clock which cycles the potential profile of the regions of the semiconductive substrate underlying the $\Phi_1$ gate electrodes above and below the fixed potential profile imposed by the virtual phase electrodes. Virtual phase CCD's require the same potential profiles as two phase CCD's, both in the $\Phi_1$ gate electrode and virtual electrode regions, to successfully directionally bias charge transfer. Edge misalignments of the type described above with reference to FIG. 9 through 14 for two phase CCD's produce similar charge transfer barriers and wells in virtual phase CCD's.

Figure 15:
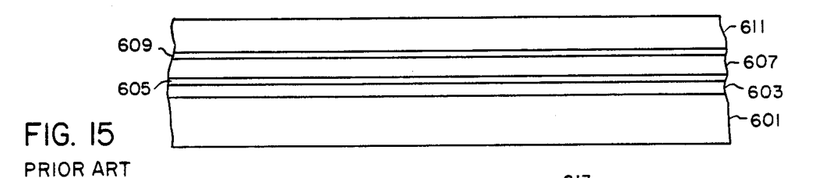
FIGS. 15 through 19 are schematic diagrams at successive stages of CCD fabrication according to a process of the prior art.

A process for the preparation of two phase and virtual phase CCD's is disclosed by Anthony et al U.S. Pat. No. 3,927,468. Referring to FIG. 15, a P conductivity type monocrystalline silicon substrate 601 is provided with a silicon dioxide layer 603 grown on one major surface. A silicon nitride layer 605 overlies the oxide layer. A polycrystalline silicon (hereinafter also referred to as P-Si) layer 607 overlies the nitride layer, and a second silicon nitride layer 609 overlies the P-Si layer. A photoresist layer 611 overlies the second silicon nitride layer.

Figure 16:
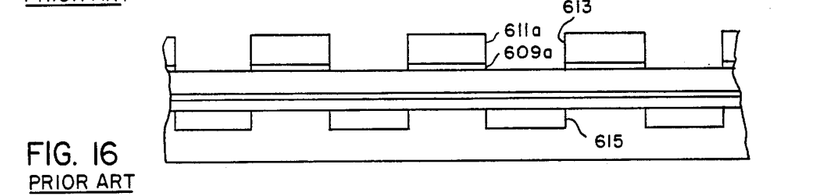

Referring to FIG. 16, to form charge transfer direction biasing implants in the silicon substrate Anthony et al first patterns the photoresist layer into segments 611a defining openings 613 therebetween. By etching through the openings the silicon nitride layer 609 is divided into barrier segments 609a, thereby extending the openings to the surface of the P-Si layer. By implanting through the P-Si layer, the silicon nitride layer 605, and the grown silicon dioxide layer 603, additional P conductivity type ions are implanted in the silicon substrate creating charge transfer direction biasing implants at spaced local zones 615.

Figure 17:
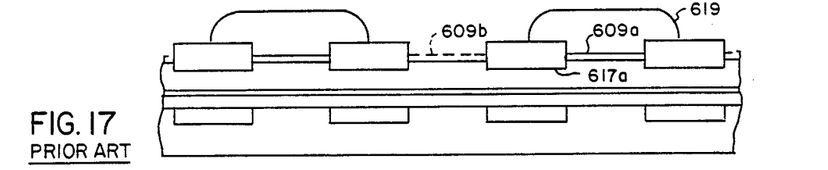

Anthony et al then undertakes to form a set of $\Phi_1$ gate electrodes overlying every other local zone. This is accomplished by removing the photoresist segments 611a and growing silicon dioxide in the openings between adjacent silicon nitride segments. The grown silicon silicon dioxide forms barrier segments 617a, as shown in FIG. 17. A patterned photoresist 619 is located to overlie and protect alternate of the first barrier segments 609a. The unprotected silicon nitride barrier segments are removed by etching, as indicated by dashed lines 609b.

Figure 18:
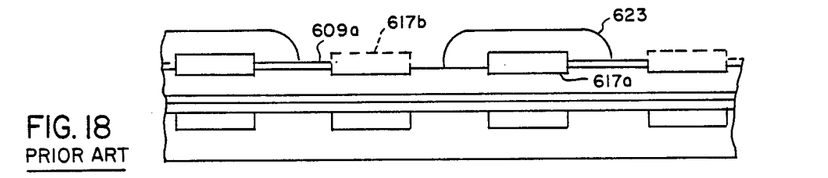

Anthony et al next removes alternate of the silicon dioxide barrier segments. The photoresist 619 is removed. Referring to FIG. 18, a patterned photoresist 623 is located to overlie and protect alternate of the silicon dioxide barrier segments segments, allowing the unprotected silicon dioxide barrier segments to be removed by etching, as indicated at 617b. The photoresist 623 is then removed.

Each two contiguous silicon nitride and silicon dioxide barrier segments together form a barrier overlying the P-Si layer in spaced relation to adjacent barriers. By etching the P-Si layer using the barriers for protection a first set of gate electrodes can be formed.

The process of Anthony et al has some notable disadvantages. First, the selection of materials for forming the barrier segments is quite limited as each must be capable of being selectively etched under conditions to which the other is resistant to etching and both must be capable of resisting etching while the P-Si layer is being etched.

Figure 19:
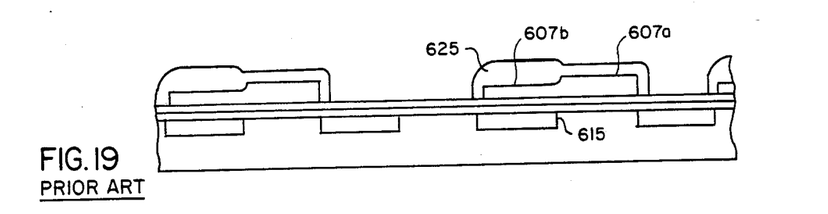

The use by Anthony et al of grown silicon dioxide to form barrier segments leads to further disadvantages. The silicon dioxide is grown by using the P-Si layer as a soruce of silicon. This locally thins the P-Si layer. Referring to FIG. 19, a stage of fabrication by the process of Anthony et al is shown at which the P-Si layer has been etched away in areas not protected by an overlying barrier. This produces gate electrodes each having a thicker portion 607a formed beneath a silicon nitride barrier segment and a thinner portion 607b formed beneath a silicon dioxide barrier segment. As shown in FIG. 19 the silicon nitride barrier segments have been removed by etching and an overall protective silicon dioxide layer 625 overlies all exposed areas of each gate electrode. Neither the gate electrodes nor the protective dioxide layers are of uniform thickness. These surface nonuniformities can lead to both optical disadvantages (e.g., light scattering) and device fabrication disadvantages resulting from nonplanar surfaces. Anthony et al further shows misalignment of the thinned edge of the gate electrodes and the edge of the underlying implant zone 615.

Figure 20:
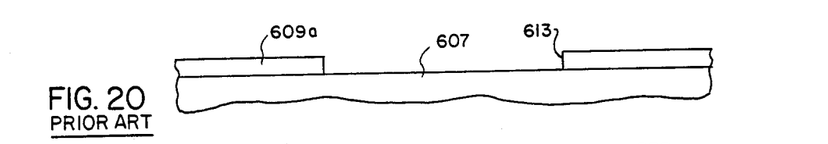
FIGS. 20 and 21 are details of intermediate stages of a prior art CCD fabrication process.
Figure 21:
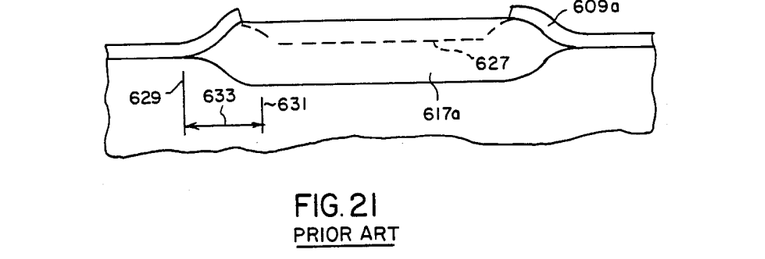

In addition to the limitations of the Anthony et al process which are acknowledged, there are additional disadvantages which result from using grown silicon dioxide and silicon nitride in combination to form barrier segments. FIG. 20 is an enlarged view of two silicon nitride barrier segments 609a defining an opening 613 on a P-Si layer 607. When silicon dioxide is grown at the P-Si layer surface, the silicon dioxide growth is not laterally confined to the opening 613. As shown in FIG. 21, the silicon dioxide barrier segment 617a covers the entire opening and additionally grows beneath the silicon nitride barrier segments adjacent the opening, forcing these adjacent barrier segment away from the P-silicon layer. This phenomenon is referred to by those skilled in the art as the "bird's beak" effect. Where a limited oxide etch is performed, as is commonly practiced to removed incidental silicon dioxide that has been formed on the surface of the silicon nitride, thereby improving the selective etching of silicon nitride, the upper configuration of the silicon dioxide barrier segment can take the configuration indicated by the dashed line 627. The vertical line 629 shows the lateral extent of the bird's beak, while the vertical line 631 shows the original lateral extent of the opening 613 and therefore the lateral extent of the implant zone. The spacing between the vertical lines, indicated by arrow 633, is a measure of zone and electrode edge misalignment. A typical bird's beak extension corresponding to the length of arrow 633 is 700 to 1000 Angstroms.

In addition to the bird's beak effect, the growth of silicon dioxide on the P-Si layer has other disadvantageous effects. Growth of silicon dioxide requires temperatures in excess of 600° C. and more typically in the range of from 800° to 950° C. These temperatures are high enough that internal migration of lattice and intersticial ions in the monocrystalline silicon substrate can and do occur. In addition to allowing migration of implanted ions, also contributing to edge misalignments, other unwanted internal ion effects can result, such as interference with internal gettering and dopant ion clustering. Physical defects, such as substrate warping, can also occur on heating. Additionally, no organic material can survive the temperatures at which silicon dioxide is grown. Still further, the growth of silicon dioxide on silicon produces localized crystal lattice stresses that can produce unwanted effects. These stresses can extend down to the monocrystalline substrate producing unwanted lattice perturbations.

SUMMARY OF THE INVENTION

In one aspect this invention is directed to a process of fabricating at a region of a first conductivity type in a semiconductive substrate a charge coupled device having at least one set of gate electrodes, wherein initially a conductive layer used to form the one set of gate electrodes overlies the region and an interface barrier means limits charge conduction therebetween, comprising (i) implanting a dopant in the semiconductive substrate region within laterally spaced local zones through the electrode forming layer, (ii) forming spaced barriers each having a first segment overlying alternate spaced local zones and a second contiguous segment overlying alternate intervals between spaced local zones, and (iii) selectively removing the conductive layer in areas not protected by the spaced barriers to form the one set of gate electrodes.

The process is characterized in that the one set of gate electrodes are formed in edge alignment with the spaced zones of the steps of (a) locating on the gate electrode forming layer a coating of a barrier forming layer which can be converted to a removal resistant form, (b) forming over the barrier forming layer a pattern forming layer and removing portions of the pattern forming layer to produce a series of laterally spaced pattern layer segments and openings therebetween, (c) through the openings, the barrier forming layer, and the gate electrode forming layer implanting the dopant in the semiconductive substrate region within the laterally spaced local zones, (d) removing the barrier layer exposed by alternate of the openings, (e) converting that portion of the barrier forming layer exposed by remaining openings to a removal resistant form to produce the first barrier segments overlying alternate spaced local zones, and (f) removing the pattern layer segments and portions of the barrier forming layer corresponding to alternate pattern layer segments to form the second barrier segments contiguous with the first barrier segments and overlying alternate intervals between the spaced local zones, each of steps (a) through (f) being performed at a temperature below that required for lattice or intersticial migration in the semiconductive substrate.

The present invention has as its purpose to provide a process for fabricating a two phase or virtual phase charge coupled device which improves on the process of Anthony et al. The present invention allows more accurate edge alignment of gate electrodes and charge transfer direction biasing implants. The present process also allows a wider choice of barrier materials than Anthony et al. More specifically, the requirement encountered by Anthony et al of choosing two barrier materials each of which can be etched while leaving the other in tact is obviated. Further, the requirement that grown silicon dioxide be employed as one barrier material is entirely obviated. Thus the disadvantages attributable to the use of grown silicon dioxide described above can be minimized or avoided entirely. The present process does not require any elevated temperatures to be employed in barrier formation. Temperatures well below those required for either intersticial or lattice ion migration can be maintained. Further, the process of this invention, by reason of the low temperatures compatible with barrier pattern formation, can employ organic barrier materials.

Further advantages of the invention can be better appreciated by reference to the following detailed description considered in conjunction with the drawings.

DESCRIPTION OF PREFERRED EMBODIMENTS

The process of the present invention for constructing CCD's such as two phase CCD 300 or an otherwise comparable virtual phase CCD exhibiting accurate alignment of higher dopant level zone and gate electrode edges can be illustrated by reference to FIG. 22. A region 701 of a first conductivity type in a semiconductive substrate is shown with an insulative layer 703 on its surface over which is located a conductive layer 705. A barrier forming layer 707 overlies the conductive layer, and a pattern forming layer 709 in turn overlies the barrier forming layer. A photoresist layer 711 overlies the pattern forming layer. The semiconductive substrate can be of either N or P conductivity type, but is preferably of the latter conductivity type, since electron minority carriers are more rapidly laterally transportable in a CCD than holes.

The first objective of the process is to increase the concentration of first conductivity type dopant in the semiconductive substrate in laterally spaced local zones, hereinafter referred to as higher impurity level or implant zones. This is accomplished by a patterned exposure of the photoresist layer 711 followed by development to leave unprotected portions of the pattern forming layer. The unprotected portions of the pattern forming layer are then removed, and the remaining photoresist is removed.

Figure 23:
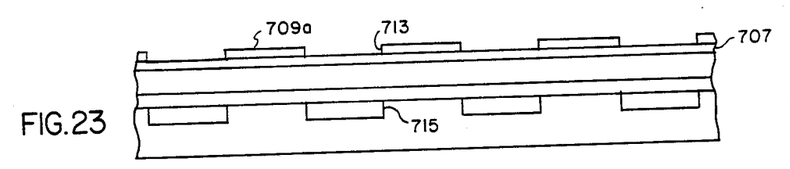

Referring to FIG. 23, this leaves pattern forming layer segments 709a on the surface of the barrier forming layer in laterally spaced relation with openings 713 therebetween. The pattern layer segments allow ions of a first conductivity type to be implanted into the semiconductive substrate at laterally spaced zones 715 corresponding to the intervals between the pattern layer segments.

The next objective is to create a first set of gate electrodes overlying alternate zones and intervals between zones. Each gate electrode overlies one zone and the contiguous interval separating the one zone from the next adjacent zone. Further, each electrode has an edge aligned with one edge of the zone it overlies and another edge aligned with a next adjacent zone which it does not overlie. The steps to accomplish this result are described by reference to FIGS. 24, 25, and 26.

Figure 24:
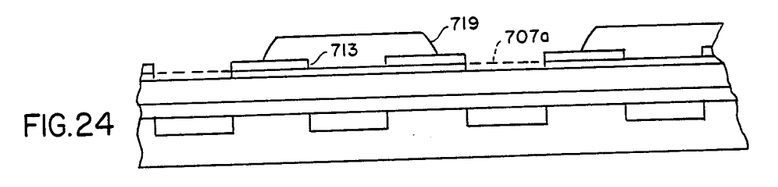

Referring first to FIG. 24, a second photoresist layer is coated uniformly over the pattern forming layer segments and barrier forming layer. Patterned exposure of the photoresist layer followed by development produces photoresist protective segments 719 overlying alternate openings 713. This protects the underlying barrier forming layer at alternate openings while leaving the barrier forming layer unprotected in remaining openings.

It is to be noted that the edges of the photoresist protective segments need not be aligned with an underlying edge. The edges of the photoresist protective segments can lie anywhere on the surface of the pattern layer segments. This avoids any need for precise edge alignment in forming the photoresist protective segments.

It is a significant advantage of the process of this invention that precise edge alignments of the implant zones and the $\Phi_1$ gate electrodes are achieved without at any point in the process requiring precise edge alignment of exposures or masks used in forming the various pattern and barrier segments. It is therefore apparent that the process of the present invention has the advantage of being what is commonly referred to as a "self-aligned" process.

With the photoresist protective segments in place the portions of the barrier forming layer protected by neither the photoresist protective segments nor the pattern forming layer segments are removed by etching, as indicated at 707a. The photoresist protective segments are then removed.

Figure 25:
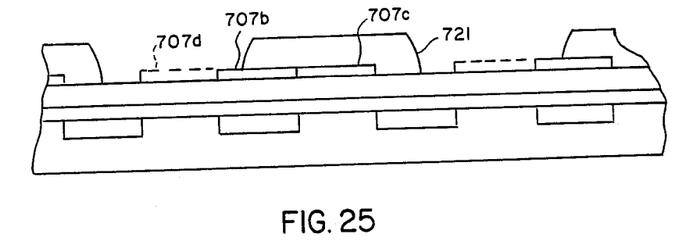

This leaves portions of the barrier forming layer between adjacent pattern forming layer segments and overlying implant zones unprotected. It is now possible to convert selectively these unprotected portions of the barrier forming layer into removal resistant first barrier segments and to remove the remaining segments of the pattern forming layer. As shown in FIG. 25 each first barrier segment 707b exactly overlies an implant zone, with the edges of the implant zone and the first barrier segment being in alignment.

The next step toward completing formation of the barriers that permit formation of the $\Phi_1$ set of gate electrodes is to remove the pattern forming layer segments by selective etching. Second photoresist protective segments 721 are then formed by uniform coating, patterned exposure, and development. These second photoresist protective segments each overlie one portion of the barrier forming layer which has not been converted to a removal resistant form. These portions of the barrier forming layer form second barrier segments 707c. The unprotected portion of the barrier layer can be removed by etching, as indicated at 707d. The contiguous pairs of first and second barrier segments remaining define laterally spaced barriers required for formation of the $\Phi_1$ set of gate electrodes.

Again, it is to be noted that no precise edge alignment of the second photoresist protective segments with the underlying segments is required. Since the first barrier segments have been converted to a removal resistant form, it is not necessary that the photoresist protect these barrier segments. Thus, location of the second photoresist protective segment edge at any point on the first barrier segments is sufficient to assure protection of the second barrier segments.

Figure 26:
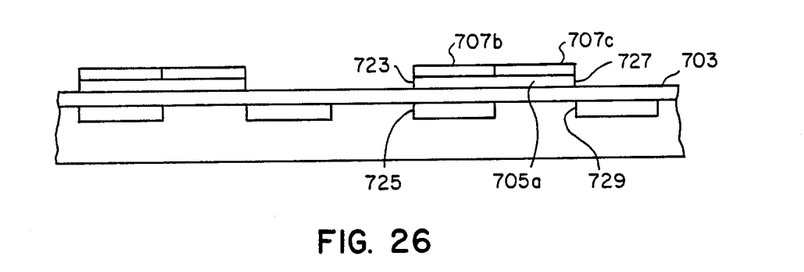

The next step of the process is to form a $\Phi_1$ set of gate electrodes which are aligned with the edges of the higher dopant level zones. This is accomplished as shown in FIG. 26 simply by removing the portions of the conductive layer that are not protected by the remaining first and second barrier segments. This results in forming a first set of gate electrodes 705a laterally spaced along the surface of the insulative layer 703. Each gate electrode overlies one of the higher dopant level zones. Each gate electrode and the zone it overlies are aligned along their outer edges 723 and 725, respectively, demarcating the interval between adjacent gate electrodes and zones. The opposite edge 727 of each gate electrode is also aligned with an edge 729 of a higher dopant level zone which lies laterally beyond the gate electrode.

Further processing can be undertaken to complete formation of either a two phase CCD or a virtual phase CCD, as desired, following conventional fabrication practices. In either case, the next processing objectives is to form a second set of electrodes, either gate electrodes or virtual electrodes. At the outset it is to be noted that the higher dopant level zones which the electrodes of the second set are intended to overlie are already in position in the semiconductive substrate. These higher dopant level zones for the second set of electrodes are identical to the corresponding zones for the first set of gate electrodes. This avoids a pitfall of prior art processes requiring the higher dopant level zones for the electrodes of the second set to be formed by dopant implantation only after the electrodes of the first set are fabricated, thereby opening up the possibility of mispositioning of these later formed zones. By simultaneously forming the higher impurity level zones underlying each set of electrodes it is possible to make both sets of zones identical. It is also possible to establish a predetermined unequal size relationship of the electrodes and/or higher impurity level zones of the two sets, if desired.

Since the first and second barrier segments overlying the gate electrodes of the first series have served their required functions, they are preferably removed. However, they can be retained, if desired.

To form a virtual phase CCD according to the invention, the next step of the process is to provide virtual phase electrodes which are as precisely aligned with the edges of the higher dopant level zones as the phase $\Phi_1$ gate electrodes 705a. The virtual phase electrodes can be formed by introducing impurity ions in areas separating the gate electrodes 705a, as taught by Fry et al U.S. Pat. No. 4,047,215 and Hynecek U.S. Pat. No. 4,229,752, cited above. As shown in FIG. 26, the gate electrodes as well as the overlying first and second barrier segments, preferably let in place at least until this step is completed, limit the areas of the semiconductive substrate available for accepting impurity ions. Thus, the first set of gate electrodes controls alignment of the virtual phase electrodes.

After the virtual electrodes have been formed, the first and second barrier segments, if still present, are removed, and the substrate is heated very briefly to a temperature which activates the implanted ions. This allows the higher conductivity imparting ions implanted to form the virtual phase electrode and the charge transfer direction biasing implants in the higher conductivity level zones to move from their initial intersticial lattice locations to assume a position in the crystal lattice structure. However, heating is limited in duration, so that diffusion over any measurable distance is not possible. A typical heating step in silicon would be to about 1000° C. for 2 seconds. Apart from this brief heating step no elevated temperatures are required or preferred in preparing a virtual phase CCD.

To form a two phase CCD, the implant step to form the virtual phase electrodes is omitted and the next step of the process is to remove the barrier segments and to form a second set of gate electrodes insulated from the first set of gate electrodes and positioned to overlie the lateral intervals between the gate electrodes of the first set. The performance characteristics of the second set of gate electrodes are preferably as nearly identical to those of the gate electrodes of the first set as possible.

Figure 27:
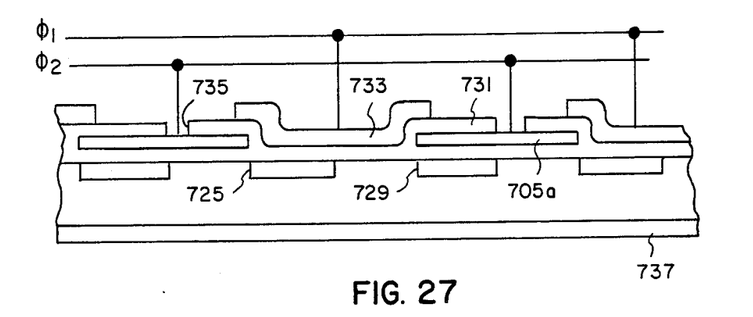
FIG. 27 is a schematic diagram of a completed two phase CCD fabricated by the process of this invention.

As shwon in FIG. 27, after removal of the first and second barrier segments, insulative material 731 is formed over the exposed surfaces of the gate electrodes of the first set, covering their edges as well as their major faces remote from the semiconductive substrate. If the first set of gate electrodes are formed of polycrystalline silicon, growth of silicon dioxide to form the insulative material 731, provides more than enough heating to allow ions in the implant zones to achieve their desired position in the crystal lattice structure. A second set of gate electrodes 733 are now formed overlying the insulative layer 703 between the gate electrodes of the first set and overlying the insulative material 731 overlying the gate electrodes of the first set.

It is to be noted that the edges of the gate electrodes 733 of the second set overlap the edges of the gate electrodes 705a of the first set. There is no necessity of accurate edge alignment, since the overlapping portions of the gate electrodes 733 are limited in their active area to the spacing between adjacent gate electrodes 705a.

Thus, because of the accurate alignment of the gate electrodes 705a, the gate electrodes 733 perform as though they are accurately aligned with the edges 725 and 729 of the higher dopant level zones even through no such accurate alignment is either sought or required. This means that only approximate alignments of the masks resulting in positioning the second gate electrodes, similarly as described above for the patterned protective segments, is required. It is important to note that two sets of gate electrodes—i.e., $\Phi_1$ and $\Phi_2$ gate electrodes—have been located with accurate edge alignment to underlying higher dopant level zones without once requiring a mask to be aligned accurately with an existing edge. Further, the higher dopant level zones associated with both series of gate electrodes can be identical.

To bring the CCD to the stage of fabrication shown in FIG. 27, apertures 735 are formed in the insulative material overlying the first set of gate electrodes. This permits electrical connection of the first set of gate electrodes to the $\Phi_1$ power source. The second gate electrodes are connected to the $\Phi_2$ power source.

A virtual phase or two phase CCD can be completed with similar processing steps. In accordance with preferred practice a conductive layer 737 is located on the major face of the semiconductive substrate opposite the gate electrodes so that the electrical potential of this surface can be regulated. Suitable electrical connections, surface passivation, if any, and encapsulation can be achieved employing conventional techniques. For example, before attachment of the electrical connections, it is preferred first to coat the entire upper surface of the CCD with a glass protective layer and then to etch openings for lead attachments. In those instances in which the CCD is used to record light exposure, the glass passivation and gate electrodes can be formed of materials sufficiently transparent to allow photon penetration into the semiconductive substrate. Where photon penetration to the semiconductive substrate, which in itself is capable of producing charge in the potential wells, is not desired, at least one layer opaque to light is located to overlie the semiconductive substrate. One convenient arrangement is to coat an opaque layer over the glass passivation layer.

It is appreciated that the process steps are readily amenable to forming varied additional elements, including other CCD's, charge input elements, such as measured charge input for testing and charge input from photodiodes, and charge output elements for delivering charge from the CCD to other circuit components. It is to be appreciated further that the CCD's themselves have been shown in perhaps their simplest forms to avoid confusion of compatible, but optional conventional features with required features. In addition to the CCD's themselves and their attendant circuit components other conventional circuit components, such as field effect transistors, diodes, capacitors, resistors, and the like, can be integrated at laterally spaced locations on the same semiconductive substrate. Further, the semiconductive substate can be of the same or of a differing conductivity type in the regions where these additional, optional elements are formed.

The materials employed for fabricating the CCD's can be selected from among those known in the art. The semiconductive substrate can be chosen from among monocrystalline semiconductive materials generally, including the Group IV elements silicon and germanium, III-V compounds, such as gallium arsenide, aluminum gallium arsenide, indium phosphide, and indium antimonide, and gallium phosphide, and other semiconductive compounds. While germanium and III-V compounds, particularly those named above, are preferred materials for high frequency applications, monocrystalline silicon (S-Si) is ordinarily the semiconductive substrate of choice for producing CCD's and further material selections are specifically illustrated by reference to S-Si semiconductive substrates.

As previously noted, the semiconductive substrate can initially be of either N or P conductivity type. High levels of conductivity are not required for the semiconductive substrate. Typically the log of N or P type impurity concentrations in ions per cc is in the range of from of from 12 to 18 in the semiconductive substrate at the start of the process. In the higher dopant level zones, formed by implanting additional N type impurity atoms, such as phosphorus or arsenic, in an N conductivity type substrate or additional P type impurity atoms, such as boron or indium, in a P conductivity type substrate, the N or P type impurity concentrations in ions per cm$^2$ is in the range of from of from $10^{10}$ to $10^{14}$. When introducing conductivity imparting ions into the semiconductive substrate to form virtual phase electrodes, the ion impurity concentrations typically range from $10^{10}$ to $10^{14}$ ions per cm$^2$.

Although omitted for simplicity from the description of the CCD's above, it is common practice to initially include in a semiconductive substrate a shallow surface implant of impurities of opposite conductivity type so that minority charge carriers are transported laterally beneath rather than at the surface of the semiconductive substrate. This avoide charge traps atrributable to surface imperfections in the semiconductive substrate. CCD's formed in this way are referred to as buried channel devices. If the semiconductive substate is initially of N or P conductivity type, the implant with atoms of P or N type, respectively, is typically in the range of $10^{10}$ to $10^{14}$ ions per cm$^2$.

In preferred embodiments of the invention, an N conductivity type channel is provided in a P conductivity type semiconductive substrate. When present, virtual phase electrodes are formed as P+ regions, which are typically pinned to a selected potential by contact with a P+ conductivity type isolating region surrounding the CCD, typically referred to as a channel stop. The higher conductivity level zone in the N conductivity type channel is preferably of P conductivity type. Preferably the depth of the higher dopant level zones and the buried channel are approximately the same.

When silicon is employed as the semiconductive substrate, the insulative layer 703 can be formed merely by oxidizing the surface of the semiconductive substrate, the resulting oxide being referred to as a grown oxide. Alternately, insulative layers, typically oxide layers, can be deposited by widely employed chemical vapor deposition (CVD) processes. Grown oxides are less readily removed than CVD oxides and are preferred in forming the insulative layer 703.

It is recognized that the function of the insulative layer 703 is to act as a barrier to charge conduction between the overlying gate electrodes and the underlying semiconductive substrate. A separate insulative layer is not essential to achieving this result. By proper choice of the gate electrode and semiconductive substrate work functions a barrier is formed to charge conduction between the semiconductive substrate and the gate. Generally the same materials combinations employed in Schottky diodes to form interface barriers can be employed. Interface work function barriers are particularly contemplated for gallium arsenide and aluminium gallium arsenide CCD's.

Formation of at least the first set of gate electrodes 705a (and hence the conductive layer 705) and both sets of gate electrodes in two phase CCD's are preferably formed by polycrystalline silicon. In the formation of two phase CCD's, forming the first set of gate electrodes of polycrystalline silicon permits the insulative layer 731 to be readily produced merely by surface oxidation of the P-Si gate electrodes. Where the CCD is employed as a light detector, the transparency of P-Si to light favors its selection. The high thermal stability of the P-Si is also advantageous in allowing passivating overlayers, such a borophosphosilicate glass to be laid down.

The preferred barrier layer material is aluminum, optionally including minor amounts of alloying metals, such as copper, gold, and silicon. Aluminum layers of about 50 to 5000 Angstroms in thickness can be conveniently employed, with aluminum layer thicknesses of about 500 to 1500 Angstroms being generally optimal. Aluminum layers can be readily formed at ambient (20°) and near ambient temperatures by vacuum vapor deposition, sputtering, or electron beam evaporation techniques.

Whereas silicon must be heated to more than 600° C. to be oxidized, aluminum can be converted to aluminum oxide at low temperatures ranging from ambient up to 200° C., with oxidation at temperatures below 100° C. being readily achieved. Aluminum can be conveniently oxidized in an RF (radio frequency) oxygen plasma. Only very slight surface oxidation of the aluminum is required to impart sufficient etch resistance to form the first barrier segments. While greater aluminum oxide thicknesses are possible using the thickest aluminum layers, in practice the aluminum barrier material layer can be reliably converted to a barrier segment which is relatively resistant to removal merely by forming a 100 to 500 Angstrom aluminum oxide layer at the surface of the initially present aluminum layer. Aluminum oxide imparts etch protection to aluminum at thicknesses which are inadequate for grown silicon dioxide to impart etch protection to silicon.

A preferred pattern forming layer material is tungsten silicide. Tungsten silicide can be readily deposited by sputtering at ambient and near ambient temperatures. Tungsten silicide pattern forming layer thicknesses in the range of from about 100 to 5000 Angstroms are preferred, with layer thicknesses of from about 200 to 1000 Angstroms being generally optimum.

Selective removal of the pattern forming layer to form pattern layer segments and selective removal of the pattern layer segments can be conveniently accomplished by reactive ion etching. A preferred reactive ion etching atmosphere is $SF_6$ optionally mixed with argon. Selective removal of aluminum, including aluminum alloys, can be conveniently accomplished by reactive ion etching in an atmosphere of $Cl_2$ and $SF_6$ preferably also containing $BCl_3$ and $HCCl_3$. For one step removal of both the first and second barrier segments—e.g., aluminum and aluminum oxide—hot phosphoric acid (optimally at about 60° C.) is an effective etchant.

The P-Si can be etched by any convenient conventional technique to form the gate electrodes. It is preferred to employ removal techniques that minimize undercutting of the various layers, particularly the P-Si layer, thereby avoiding lateral compensations in design to achieve alignment of implant zone and gate electrode edges. Techniques for both isotropic and anisotropic removal of a variety of possible fabrication materials including P-Si are illustrated by Sugishima et al U.S. Pat. No. 4,352,724. Still other techniques are known to the art and be readily applied to the practice of the disclosed process.

The various photoresist layers employed in the fabrication of the CCD are preferably chosen from among conventional positive working photoresists. Specifically preferred positive working photoresists are those disclosed by Daly et al U.S. Pat. No. 4,365,019 and Engebrecht et al U.K. Pat. No. 1,546,633.

While the foregoing constitute preferred materials selections for the various layers employed in fabricating CCD's according to the process of this invention, it is appreciated that alternative materials selections are possible, provided the selective patterning capabilities of the process are retained. For example, materials such as refractory metals, amorphous or polycrystalline silicon, low temperature silicon dioxide (LTO, which can be deposited at temperatures ranging from ambient to 400° C. and can be readily removed under much milder etching conditions than grown silicon dioxide), silicon nitride, metal silicides (e.g., platinum silicide, molybdenum silicide, and other refractory metal silicides) all offer the low temperature formation and selective pattern forming capabilities to permit their substitution for one or more of the preferred pattern forming and barrier materials listed above.

It is specifically contemplated to employ organic materials to form barriers. For example, referring to FIGS. 22 through 26, a conventional negative-working (NW) photoresist can be substituted for aluminum as the barrier forming layer 707. When the NW photoresist is overcoated with tungsten silicide, it is protected from inadvertent exposure by the pattern forming layer 709. After the pattern layer segments 709a are formed, ion implantation can be undertaken to produce the implant zones. The photoresist can be selectively exposed to actinic radiation in alternate openings to convert it to a removal resistant form and thereafter developed to remove photoresist in areas corresponding to the remaining openings. Note that the use of protective segments 719 are not required to achieve this result, thereby simplifying the process.

The next step is to remove the remaining pattern layer segments. After the pattern layer segments have been removed, the photoresist segments 707c can be selectively exposed to actinic radiation without exposing remaining unexposed photoresist. Further, no mask edge alignment is required to perform this step. Note that this further allows the use of positive working photoresist forming the segments 721 to be entirely eliminated. Removal of the remaining unexposed NW photoresist in the areas 707d can be achieved by performing a conventional photoresist development step. This completes formation of barriers formed entirely of the exposed NW photoresist. Etching of the P-Si layer in areas not protected by exposed NW photoresist barriers can be readily accomplished, and fabrication of the CCD can be completed by the procedures previously described.

Suitable NW photoresists can be chosen from among a variety of conventional forms. NW photoresists are disclosed by Lydick et al U.S. Pat. No. 3,488,194, Dunham et al U.S. Pat. No. 3,711,287, McBride et al U.K.

Pat. No. 1,342,884, DeBoer U.S. Pat. No. 3,782,938, and Tan et al U.S. Pat. Nos. 4,289,842 and 4,568,734, the disclosures of which are here incorporated by reference. Useful negative working photoresists are also disclosed in Lindstrom U.S. Ser. No. 734,646, filed May 16, 1985, and Turner et al U.S. Ser. No. 831,951, filed Feb. 24, 1986, both commonly assigned.

In the construction of the CCD described above it is to be appreciated that conventional cleaning steps can be and usually are practiced initially and at various interim stages. For example, washing with deinoized water is common following etching or other steps which tend to leave particulate residues. It is also recognized that the deionized water can itself contain dilute etchants, such as hydrofluoric or nitric acid. Although not required, additional etching and supplemental heating steps can be used to optimize layer thicknesses, if desired.

EXAMPLES

The invention can be better appreciated by reference to the following specific example:

EXAMPLE 1

Figure 22:
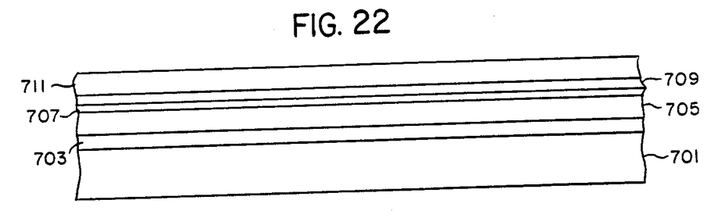
FIGS. 22 through 26 are schematic diagrams of a CCD at successive stages of fabrication according to the process of this invention.

The structural arrangement shown in FIG. 22 was employed as a starting element for the practice of the process. The arrangement consisted of a P conductivity type silicon wafer substrate corresponding to 701 wherein the wafer contained $10^{15}$ boron ions per cc. A buried channel forming N type phosphorus dopant was present at the upper surface of the wafer at a surface concentration of $3 \times 10^{12}$ ions per cm$^2$. A grown silicon dioxide layer 0.05 $\mu$m in thickness corresponding to layer 703 was present, and over this insulative layer was a phosphorus doped polycrystalline silicon layer corresponding to layer 705. An aluminum layer 0.01 $\mu$m in thickness corresponding to layer 707 was located on the polycrystalline silicon layer. A sputtered tungsten silicide layer 0.05 $\mu$m in thickness corresponding to layer 709 was formed over the aluminum layer. The portions of the wafer intended to form CCD's and having the layer arrangement shown in FIG. 22 were peripherally isolated from other areas of the wafer, not shown in FIG. 22, by channel stops formed by local edge introduction of P conductivity type dopant and field oxide edge growths. This type of edge isolation is known and forms no part of the present invention.

A positive working photoresist of the composition disclosed in Example 1 of U.S. Pat. No. 4,365,019 was spun over the surface of the tungsten silicide layer, imagewise exposed through a photolithographic mask using ultraviolet actinic radiation, and developed using a 1.5 weight percent tetramethylammonium hydroxide aqueous solution. The same photoresist composition, exposing radiation, and developer were employed in all subsequent steps referring to photoresist layers. Rectangular openings 2 $\mu$m $\times$ 500 $\mu$m on a edge were thus formed in the photoresist layer with a spacing of 7 $\mu$m between openings.

The tungsten silicide layer was then reactive ion etched using SF$_6$ and argon gases to expose the upper surface of the aluminum layer. This produced discrete tungsten silicide segments separated by openings, corresponding to 709a and 713, respectively, in FIG. 23. An ion implantation of boron ions was then performed through the openings to produce zones of added P type impurity corresponding to 715.

A second photoresist layer was coated and patterned to cover alternate of the openings 713. The portions of the aluminum layer lying beneath the uncovered openings was then reactive ion etched using a mixture of Cl$_2$, SF$_6$, CHCl$_3$, and BCL$_3$ gases.

The photoresist layer was then stripped, and the wafer was exposed to an oxygen plasma to convert chemically the aluminum layer to an oxidized form in areas not covered by the tungsten silicide segments—i.e., in areas where aluminum remained exposed by the openings. At the conclusion of this step the wafer contained on its upper surface aluminum oxide first barrier segments and aluminum segments corresponding to 707b and 707c, respectively, but with aluminum segments also located at 707d.

To remove the latter aluminum segments the first step is to remove the discrete tungsten silicide segments 709a. This was done by reactive ion etching using SF$_6$ and argon gases. Next, a positive working photoresist pattern as shown in FIG. 25 was then formed over the interlaid pattern of segments. A photolithographic mask was positioned on the photoresist layer with openings overlying alternate of the aluminum segments and openings just slightly larger than the width of the aluminum segments so that the edges of the openings were actually over laterally adjacent surfaces. Thus, precise edge alignment of the mask with the underlying segment pattern was not required. The aluminum segments not protected by photoresist following development were etched away using a the same reactive ion etch technique described above for removing aluminum. The remaining photoresist was then stripped. This left in place barriers each comprised of an aluminum oxide first barrier segment and an aluminum second barrier segment, corresponding to segments 707b and 707c in FIG. 25.

To remove the polycrystalline silicon not required for forming the $\Phi_1$ gate electrodes the wafers were reactive ion etched using a mixture of Cl$_2$ and SF$_6$ gases. The polycrystalline silicon not protected by the barriers was removed. At the completion of this step the device appeared as shown in FIG. 26.

Fabrication through this step of the process was compatible with forming either a virtual phase or two phase CCD. Except for the initial step of growing the silicon dioxide layer 703, the various steps were performed at or near ambient temperatures (well below 100° C.). Since the initial silicon dioxide growth step occurred before introduction of the charge direction biasing implants, this heating step had no impact on achieving the desired precise gate electrode and implant zone edge alignments.

EXAMPLE 2

This example illustrates the completion of the fabrication steps described in Example 1 to produce a two phase CCD.

The wafer was then given a surface etch in hot phosphoric acid to remove the barriers. The wafer was covered with a photoesist layer on its upper surface, and the lower or back side of the wafer was etched with SF$_6$ plasma. The photoresist layer was stripped, and the wafer was dipped in a weak solution of hydrofluoric acid. A silicon dioxide layer was grown by heating the wafer to 950° C. in a wet ambient atmosphere.

The wafer was coated on its upper surface with chemically vapor deposited polycrystalline silicon which was phosphorus doped in a diffusion furnace.

The wafer was then coated with a photoresist layer, which by exposure and development was removed from all areas on the top of the wafer, except those corresponding to desired locations for Φ₂ gate electrodes, as shown in FIG. 27. Unprotected polycrystalline silicon was removed with a sulfur hexafluoride plasma etch, and the remaining photoresist was then stripped.

At this point, the device shown in FIG. 27 was complete, except for conventional conductive layer deposition steps. When these conventional steps were performed and the device tested, it was found to have the desired charge transfer properties, indicating that successful edge alignment of P conductivity type implant zones 715 with the edges of the Φ₁ and Φ₂ gate electrodes had been accomplished without tedious and precise edge alignment of the photolithographic masks employed in the various photoresist patterning steps.

The invention has been described in detail with particular reference to preferred embodiments thereof, but it will be understood that variations and modifications can be effected within the spirit and scope of the invention.

What is claimed is:

1. A process of fabricating at a region of a first conductivity type in a semiconductive substrate a two phase or virtual phase charge coupled device having at least one set of gate electrodes, wherein initially a conductive gate electrode forming layer used to form said one set of gate electrodes overlies said region and an interface barrier means limits charge conduction therebetween, comprising
   (i) implanting a dopant in said semiconductive substrate region within laterally spaced local zones through said gate electrode forming layer,
   (ii) forming spaced barriers each having a first barrier segment overlying alternate spaced local zones and a second contiguous barrier segment overlying alternate intervals between spaced local zones,
   (iii) selectively removing said conductive gate electrode forming layer in areas not protected by said spaced barrier to form said one set of gate electrodes, and
   (iv) locating a second set of gate electrodes between adjacent electrodes of said one set,
   characterized in that said one set of gate electrodes are formed in edge alignment with said spaced zones by the steps of
   (a) locating on said gate electrode forming layer a coating of a barrier forming layer which can be converted to a removal resistant form,
   (b) forming over said barrier forming layer a pattern forming layer and removing portions of said pattern forming layer to produce a series of laterally spaced pattern layer segments and openings therebetween,
   (c) through the openings, said barrier forming layer, and said gate electrode forming layer implanting said dopant in said semiconductive substrate region within said laterally spaced local zones,
   (d) removing said barrier forming layer exposed by alternate of the openings,
   (e) converting that portion of said barrier forming layer exposed by remaining openings to a removal resistant form to produce said first barrier segments overlying alternate spaced local zones, and
   (f) removing the pattern layer segments and portions of the barrier forming layer corresponding to alternate pattern layer segments to form said second barrier segments contiguous with said first barrier segments and overlying alternate intervals between said spaced local zones,
   each of steps (a) trough (f) being performed at a temperture below that required for lattice or intesticial migration in said semiconductive substrate.

2. A process according to claim 1 wherein prior to associating said conductive layer and interposed barrier means with said semiconductive substrate an impurity dopant of a second conductivity type is introduced into said semiconductive substrate a buried channel for lateral charge conduction.

3. A process according to claim 1 in which said semiconductive substrate is monocrystalline silicon and said barrier means is formed on said semiconductive substrate by surface oxidation.

4. A process according to claim 1 in which said barrier forming layer is comprised of aluminum.

5. A process according to claim 4 in which said exposed portions of said aluminum barrier forming layer are converted to a removal resistant form by oxidation.

6. A process according to claim 1 in which said barrier forming layer is comprised of a negative-working photoresist.

7. A process according to claim 1 in which said pattern forming layer is comprised of tungsten silicide.

8. A process of fabricating a charge coupled device according to claim 1 in which said semiconductive substrate is monocrystalline silicon of P conductivity type having an N conductivity type channel adjacent said interface barrier means, said conductive layer is polycrystalline silicon, and said interface barrier means is grown silicon dioxide, further characterized in that said one set of gate electrodes are formed in edge alignment with said spaced zones by the steps of
   (a) locating on said gate electrode a layer comprised of a negative-working photoresist to serve as a barrier forming layer,
   (b) forming over said photoresist layer a tungsten silicide layer and removing portions of said tungsten silicide layer to produce a series of laterally spaced tungsten silicide layer segments and openings therebetween,
   (c) through the openings, said photoresist layer, and said gate electrode forming layer implanting a P conductivity type dopant in said semiconductive substrate region within said laterally spaced local zones,
   (d) exposing portions of said photoresist layer beneath alternate of the openings to actinic radiation to form first photoresist barrier segments,
   (e) selectively removing portions of said photoresist layer beneath remaining of the openings,
   (f) removing said tungsten silicide segments and portions of said photoresist layer corresponding to alternate tungsten silicide segments to form second photoresist barrier segments contiguous with said first photoresist barrier segments,
   (g) removing said polycrystalline silicon layer not protected by said photoresist barrier segments to form said first set of gate electrodes, and
   (h) growing silicon dioxide on said one set of the gate electrodes, and
   (i) forming said second set of electrodes as polycrystalline silicon gate electrodes between adjacent gate electrodes of said one set.

9. A process according to claim 1 in which said electrodes of said second set are virtual electrodes produced by implanting a first conductivity type dopant in said semiconductive substrate following formation of said first set of electrodes.

10. A process according to claim 1 in which said second set of electrodes are formed by depositing a conductive material on said interface barrier mans between said adjacent electrodes of said one set.

11. A process of fabricating a charge coupled device according to claim 1 in which said semiconductive substrate is monocrystalline silicon of P conductivity type having an N conductivity type channel adjacent said interface barrier means, said conductive gate electrode forming layer is polycrystalline silicon, and said interface barrier means is grown silicon dioxide, further characterized in that said one set of gate electrodes are formed in edge alignment with said spaced zones by the steps of (a) locating on said gate electrode forming layer a layer comprised of aluminum to serve as a barrier forming layer, (b) forming over said aluminum layer a tungsten silicide layer and removing portions of said tungsten silicide layer to produce a series of laterally spaced tungsten silicide layer segments and openings therebetween, (c) through the openings, said aluminum layer, and said gate electrode forming layer implanting a P conductivity type dopant in said semiconductive substrate region within said laterally spaced local zones, (d) removing portions of said aluminum layer exposed by alternate of the openings, (e) surface oxidizing that portion of said aluminum layer exposed by remaining openings to form oxidized alluminum barrier segments, (f) removing said tungsten silicide segments and portions of the aluminum layer corresponding to alternate tungsten silicide segments to form aluminum barrier segments contiguous with said oxidized aluminum barrier segments, (g) removing said polycrystalline silicon layer not protected by said aluminum or aluminum oxide barrier segments to form said one set of gate electrodes, and (h) implanting a P conductivity type dopant into said silicon substrate between said electrodes of said one set to form a virtual phase CCD, each of steps (a) through (b) being performed at a temperature below that required for lattice or intersticial migration in said semiconductive substrate.

12. A process of fabricating a charge coupled device according to claim 1 in which said semiconductive substrate is monocrystalline silicon of P conductivity type having an N conductivity type channel adjacent said interface barrier means, said conductive layer is polycrystalline silicon, and said interface barrier means is grown silicon dioxide, further characterized in that said one set of gate electrodes are formed in edge alignment with said spaced zones by the steps of (a) locating on said gate electrode forming layer a layer comprised of aluminum to serve as a barrier forming layer, (b) forming over said aluminum layer a tungsten silicide layer and removing portions of said tungsten silicide layer to produce a series of laterally spaced tungsten silicide layer segments and openings therebetween, (c) through the openings, said aluminum layer, and said gate electrode forming layer implanting a P conductivity type dopant in said semiconductive substrate region within said laterally spaced local zones, (d) removing portions of said aluminum layer exposed by alternate of the openings, (e) surface oxidizing that portion of said aluminum layer exposed by remaining openings to form oxidized aluminum barrier segments, (f) removing said tungsten silicide segments and portions of said aluminum layer corresponding to alernate tungsten silicide segments to form aluminum barrier segments contiguous with said oxidized aluminum barrier segments.

(g) removing said polycrystalline silicon layer not protected by said aluminum or aluminum oxide barrier segments to form said one set of gate electrodes, (h) growing silicon dioxide on said first set gate electrodes, and (i) forming said second set of polycrystalline silicon gate electrodes between adjacent gate electrodes of said one set.

13. A process of fabricating a charge coupled device according to claim 1 in which said semiconductive substrate is monocrystalline silicion of P conductivity type having an N conductivity type channel adjacent said interface barrier means, said conductive layer is polycrystalline silicon, and said interface barrier means is grown silicon dioxide, further characterized in that said one set of gate electrodes are formed in edge alignment with said spaced zones by the steps of (a) locating on said gate electrode a layer comprised of a negative-working photoresist to serve as a barrier forming layer, (b) forming over said photoresist layer a tungsten silicide layer and removing portions of said tungsten silicide layer to produce a series of laterally spaced tungsten silicide layer segments and openings therebetween, (c) through the openings, said photoresist layer, and said gate electrode forming layer implanting a P conductivity type dopant in said semiconductive substrate region within said laterally spaced local zones, (d) exposing portions of said photoresist layer beneath alternate of the openings to actinic radiation to form first photoresist barrier segments, (e) selectively removing portions of said photoresist layer beneath remaining of the openings, (f) removing said tungsten silicide segments and portions of said photoresist layer corresponding to alternate tungsten silicide segments to form second photoresist barrier segments contiguous with said first photoresist barrier segments, (g) removing said polycrystalline silicon layer not protected by said photoresist barrier segments to form said one set of gate electrodes, and (h) implanting a P conductivity type dopant into said silicon substrate between said electrodes of said one set to form a virtual phase CCD, each of steps (a) through (h) being performed at a temperature below that required for lattice or intersticial migration in said semiconductive substrate.

* * * * *